(12) United States Patent
Lee et al.

(10) Patent No.: US 12,224,299 B2
(45) Date of Patent: Feb. 11, 2025

(54) SENSOR PACKAGE STRUCTURE

(71) Applicant: KINGPAK TECHNOLOGY INC., Hsin-Chu County (TW)

(72) Inventors: Chien-Chen Lee, Hsin-Chu County (TW); Li-Chun Hung, Hsin-Chu County (TW); Chien-Yuan Wang, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 413 days.

(21) Appl. No.: 17/720,398

(22) Filed: Apr. 14, 2022

(65) Prior Publication Data
US 2023/0215896 A1    Jul. 6, 2023

(30) Foreign Application Priority Data
Dec. 30, 2021    (TW) .................................. 110149595

(51) Int. Cl.
*H01L 27/146*    (2006.01)

(52) U.S. Cl.
CPC .. *H01L 27/14636* (2013.01); *H01L 27/14618* (2013.01)

(58) Field of Classification Search
CPC .................... H01L 27/14636; H01L 27/14618
See application file for complete search history.

(56) References Cited

U.S. PATENT DOCUMENTS

| 7,195,940 B2 | 3/2007 | Bolken et al. | |
| 11,075,235 B2 * | 7/2021 | Kohama | H04N 23/54 |
| 2003/0025825 A1 * | 2/2003 | Nakajoh | H04N 23/54 |
| | | | 257/E31.118 |
| 2007/0291216 A1 * | 12/2007 | Chan | G02F 1/1339 |
| | | | 349/110 |
| 2008/0083964 A1 * | 4/2008 | Fujimoto | H01L 27/14618 |
| | | | 257/E31.127 |
| 2017/0264799 A1 * | 9/2017 | Wang | H04N 23/54 |
| 2018/0035022 A1 * | 2/2018 | Wang | B29C 43/52 |
| 2018/0376041 A1 * | 12/2018 | Miura | H04N 23/55 |

(Continued)

FOREIGN PATENT DOCUMENTS

WO    WO-2018079644 A1 *    5/2018    ............. H01L 23/12

*Primary Examiner* — William B Partridge
*Assistant Examiner* — Felix B Andrews
(74) *Attorney, Agent, or Firm* — Li & Cai Intellectual Property (USA) Office

(57) ABSTRACT

A sensor package structure is provided. The sensor package structure includes a substrate, a sensor chip, a ring-shaped wall, and a light-permeable layer. The substrate has a first surface and a second surface that is opposite to the first surface. The first surface of the substrate has a chip-bonding region and a connection region that surrounds the chip-bonding region, and the substrate has a plurality of protrusions arranged in the connection region. The sensor chip is disposed on the chip-bonding region of the substrate and is electrically coupled to the substrate. The ring-shaped wall is formed on the connection region of the substrate, and the protrusions of the substrate are embedded in and gaplessly connected to the ring-shaped wall. The light-permeable layer is disposed on the ring-shaped wall, and the light-permeable layer, the ring-shaped wall, and the substrate jointly define an enclosed space therein.

10 Claims, 10 Drawing Sheets

(56) References Cited

U.S. PATENT DOCUMENTS

| | | | |
|---|---|---|---|
| 2019/0086771 A1* | 3/2019 | Shen | H04N 23/55 |
| 2019/0148429 A1* | 5/2019 | Wang | H01L 23/10 |
| | | | 348/294 |
| 2019/0165019 A1* | 5/2019 | Wang | H01L 27/14634 |
| 2020/0336627 A1* | 10/2020 | Wang | H04N 23/55 |
| 2021/0399035 A1* | 12/2021 | Punzalan | H01L 27/14618 |

* cited by examiner

SENSOR PACKAGE STRUCTURE

CROSS-REFERENCE TO RELATED PATENT APPLICATION

This application claims the benefit of priority to Taiwan Patent Application No. 110149595, filed on Dec. 30, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

In a conventional sensor package structure, a glass board is fixed onto a substrate through an adhesive so as to jointly form an interior space that accommodates a sensor chip. However, since moisture can easily seep into the interior space through a connection interface between the adhesive and the substrate, the sensing function of the sensor chip of the conventional sensor package structure can easily be affected.

SUMMARY OF THE DISCLOSURE

In response to the above-referenced technical inadequacies, the present disclosure provides a sensor package structure to effectively improve on the issues associated with conventional sensor package structures.

In one aspect, the present disclosure provides a sensor package structure includes a substrate, a sensor chip, a ring-shaped wall, and a light-permeable layer. The substrate has a first surface and a second surface that is opposite to the first surface. The first surface of the substrate has a chip-bonding region and a connection region that surrounds the chip-bonding region, and the substrate has a plurality of protrusions arranged in the connection region. The sensor chip is disposed on the chip-bonding region of the substrate and is electrically coupled to the substrate. The ring-shaped wall is formed on the connection region of the substrate, and the protrusions of the substrate are embedded in and gaplessly connected to the ring-shaped wall. The light-permeable layer is disposed on the ring-shaped wall, and the light-permeable layer, the ring-shaped wall, and the substrate jointly define an enclosed space therein.

Therefore, the sensor package structure of the present disclosure is provided with the protrusions that are embedded in and gaplessly connected to the ring-shaped wall, so that the contact area and connection strength between the substrate and the ring-shaped wall can be effectively increased, and the protrusions can lengthen a traveling path of moisture that is defined along the connection interface between the substrate and the ring-shaped wall.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
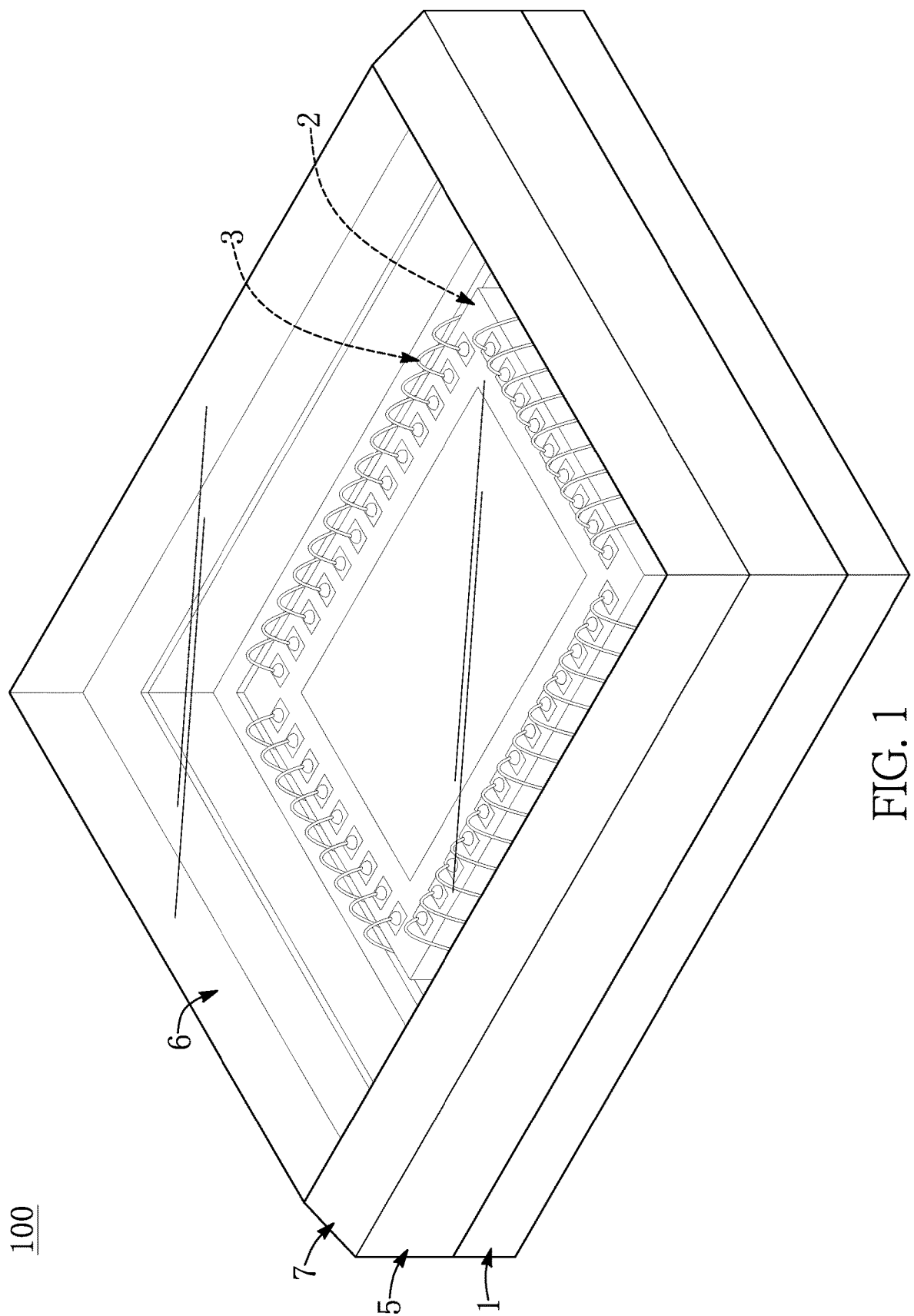
FIG. 1 is a perspective view of a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
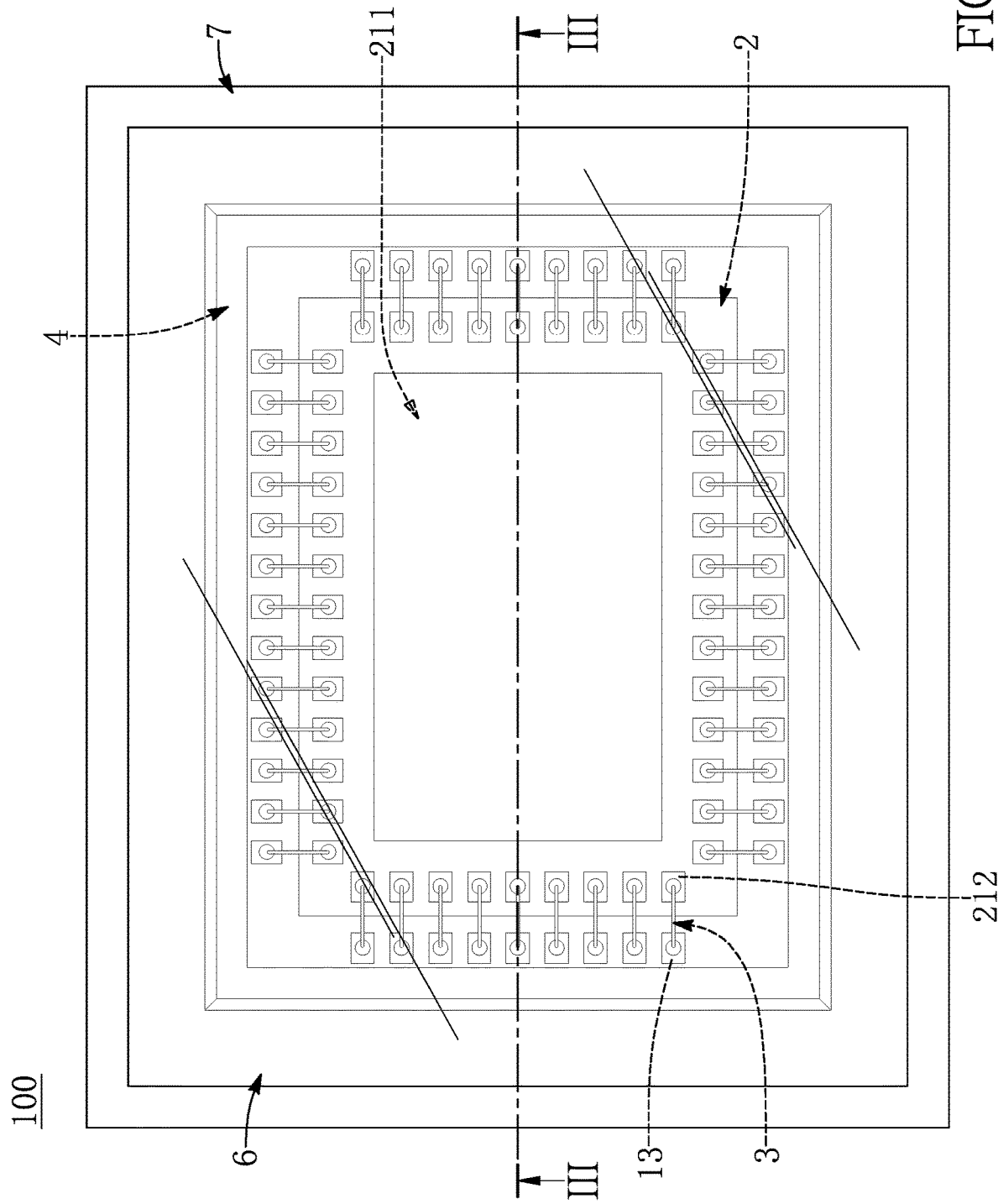
FIG. 2 is a top view of FIG. 1.

Referring to FIG. 1 to FIG. 7, a first embodiment of the present disclosure is provided. As shown in FIG. 1 and FIG. 2, the present embodiment provides a sensor package structure 100. In other words, any package structure not encapsulating a sensor chip therein has a structural design different from that of the sensor package structure 100 of the present embodiment.

Figure 3:
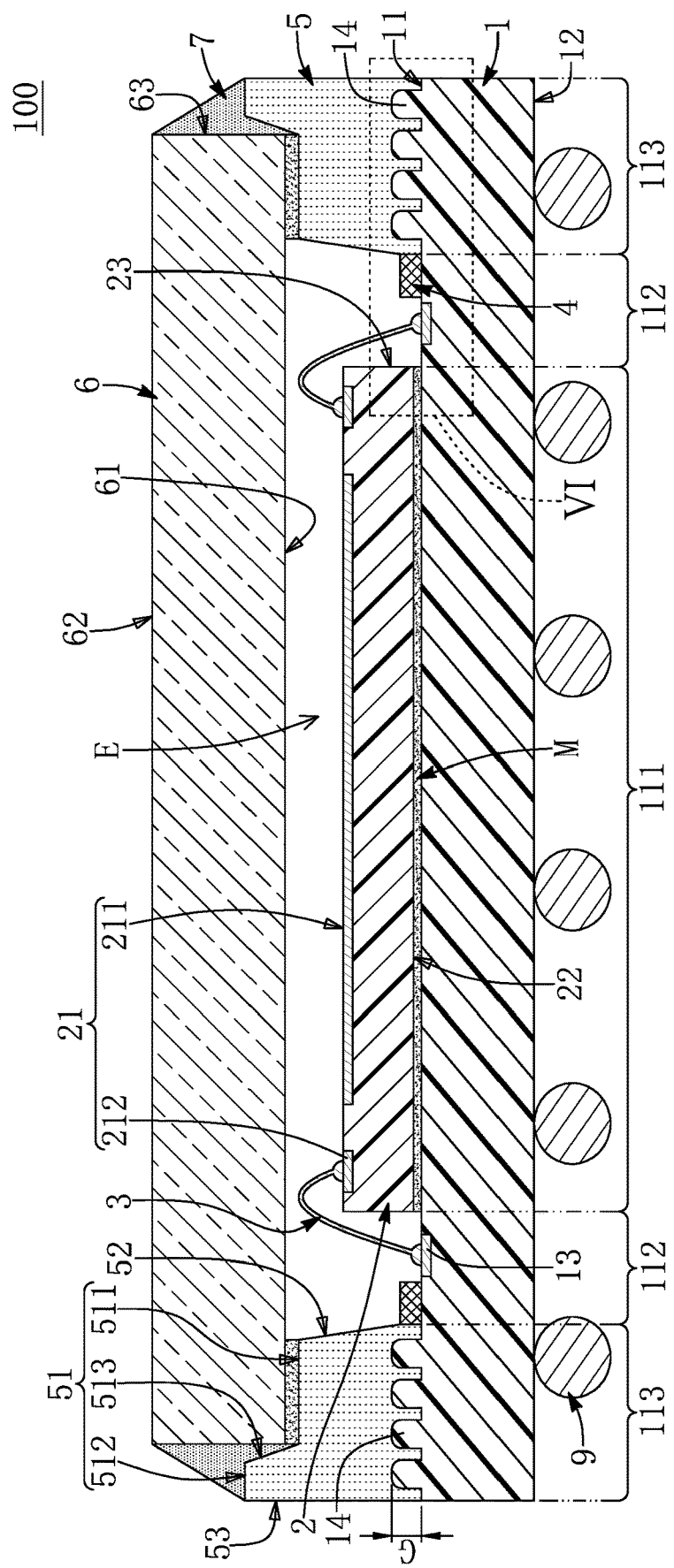
FIG. 3 is a cross-sectional view taken along line III-III of FIG. 2.
Figure 4:
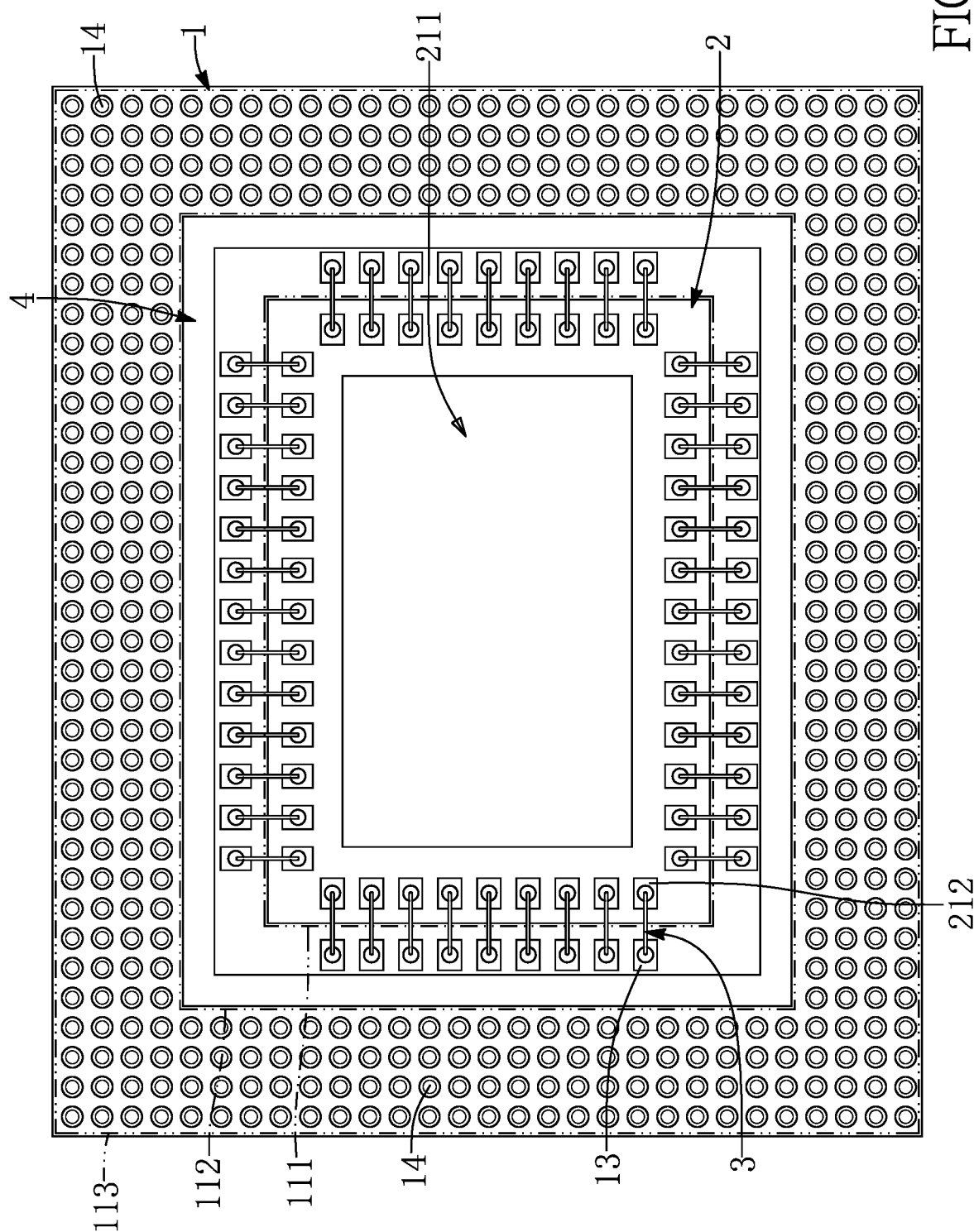
FIG. 4 is a top view showing the sensor package structure of FIG. 1 with a ring-shaped wall, a light-permeable layer, and an external sealing adhesive being omitted.

As shown in FIG. 2 to FIG. 4, the sensor package structure 100 includes a substrate 1, a sensor chip 2 disposed on and electrically coupled to the substrate 1, a plurality of metal wires 3 electrically coupling the sensor chip 2 and the substrate 1, a ring-shaped stopping rib 4 disposed on the substrate 1, a ring-shaped wall 5 disposed on the substrate 1, a light-permeable layer 6 disposed on the ring-shaped wall 5, and an external sealing adhesive 7 that is disposed on the ring-shaped wall 5 and that surrounds the light-permeable layer 6.

The sensor package structure 100 in the present embodiment includes the above components, but can be adjusted or changed according to design requirements. For example, in other embodiments of the present disclosure not shown in the drawings, the sensor package structure 100 can be provided without the metal wires 3, and the sensor chip 2 is fixed onto and electrically coupled to the substrate 1 in a flip-chip manner; or, the ring-shaped stopping rib 4 and/or the external sealing adhesive 7 of the sensor package structure 100 can be omitted or can be replaced by other components. The structure and connection relationship of each component of the sensor package structure 100 will be described in the following description.

The substrate 1 in the present embodiment can be in a square shape or a rectangular shape, but the present disclosure is not limited thereto. The substrate 1 has a first surface 11 and a second surface 12 that is opposite to the first surface 11. The first surface 11 of the substrate 1 has a chip-bonding region 111, a spacing region 112 arranged outside of the chip-bonding region 111, and a connection region 113 that surrounds the spacing region 112 (and the chip-bonding region 111).

Specifically, the substrate 1 includes a plurality of soldering pads 13 that are located between the chip-bonding region 111 and the connection region 113 (i.e., the soldering pads 13 are located on the spacing region 112). The soldering pads 13 in the present embodiment are substantially in a ring-shaped arrangement, but the present disclosure is not limited thereto. For example, in other embodiments of the present disclosure not shown in the drawings, the soldering pads 13 can be arranged in two rows respectively at two opposite sides of the chip-bonding region 111.

Figure 5:
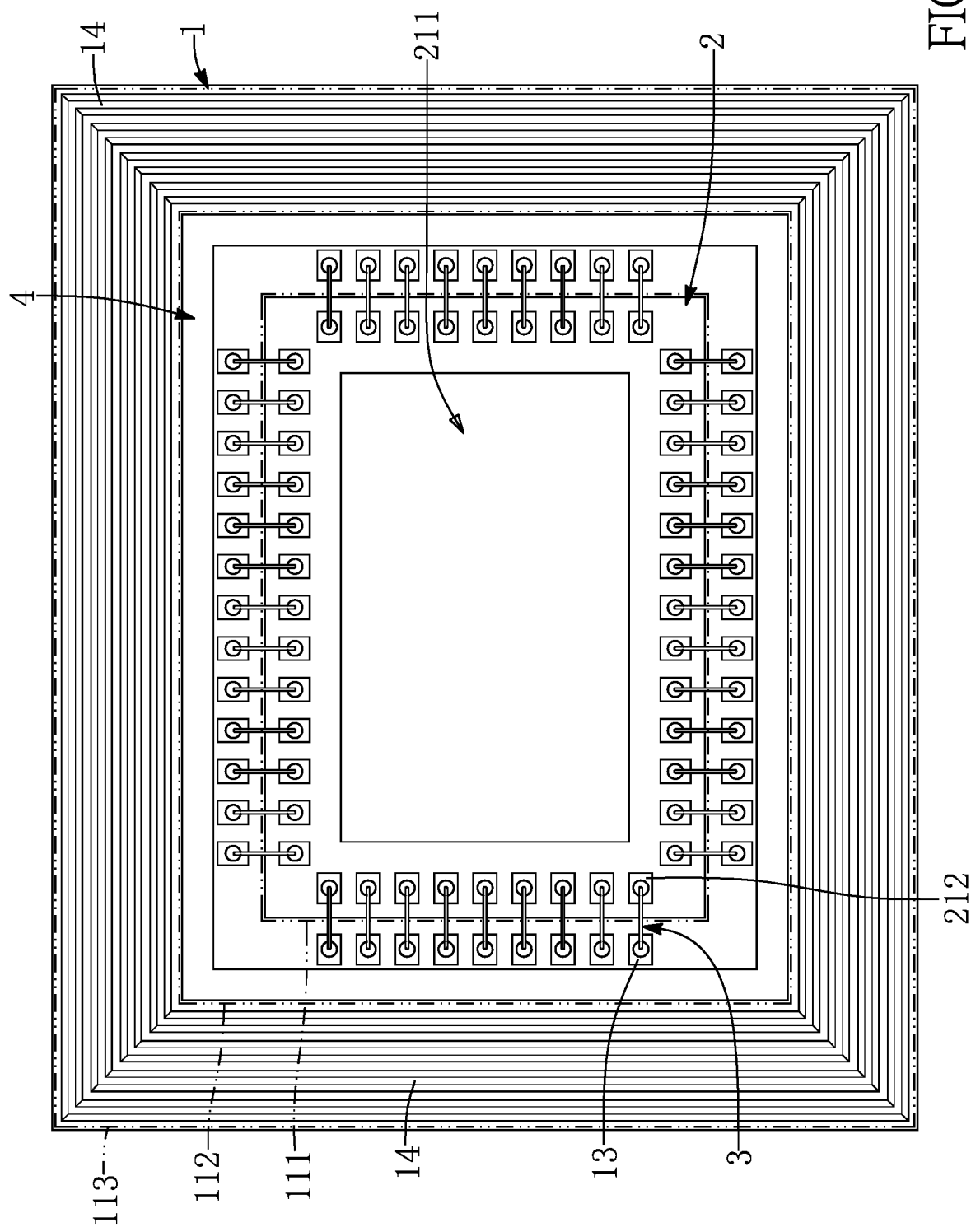
FIG. 5 is a top view showing the sensor package structure of FIG. 4 in another configuration.

Moreover, the substrate 1 has a plurality of protrusions 14 arranged on the connection region 113, and the structural design and distribution of the protrusions 14 can be adjusted or changed according to design requirements. In the present embodiment, the protrusions 14 are in a ring-shaped arrangement and are distributed on at least 80% (area) of the connection region 113, and the protrusions 14 are preferably bump dots, but the present disclosure is not limited thereto. For example, as shown in FIG. 5, any one of the protrusions 14 is ring-shaped and surrounds the spacing region 112.

Figure 6:
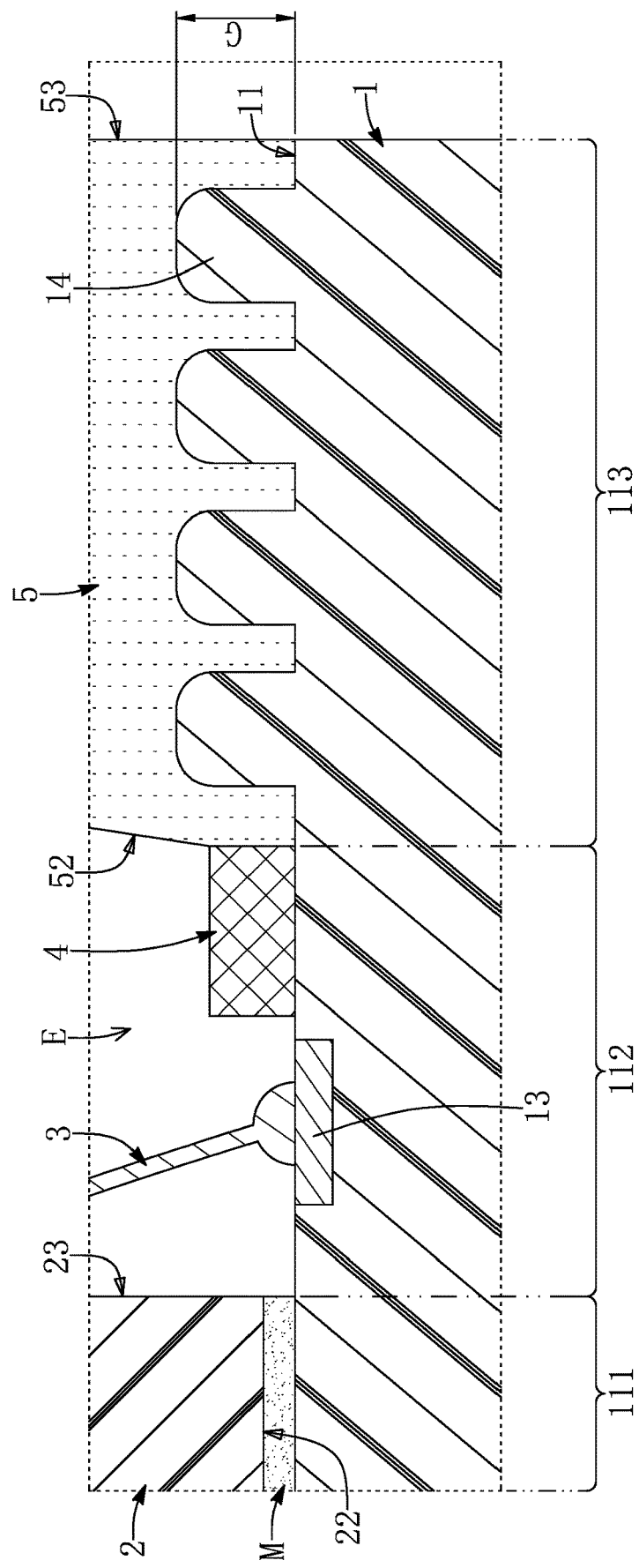
FIG. 6 is an enlarged view of part VI of FIG. 3.
Figure 7:
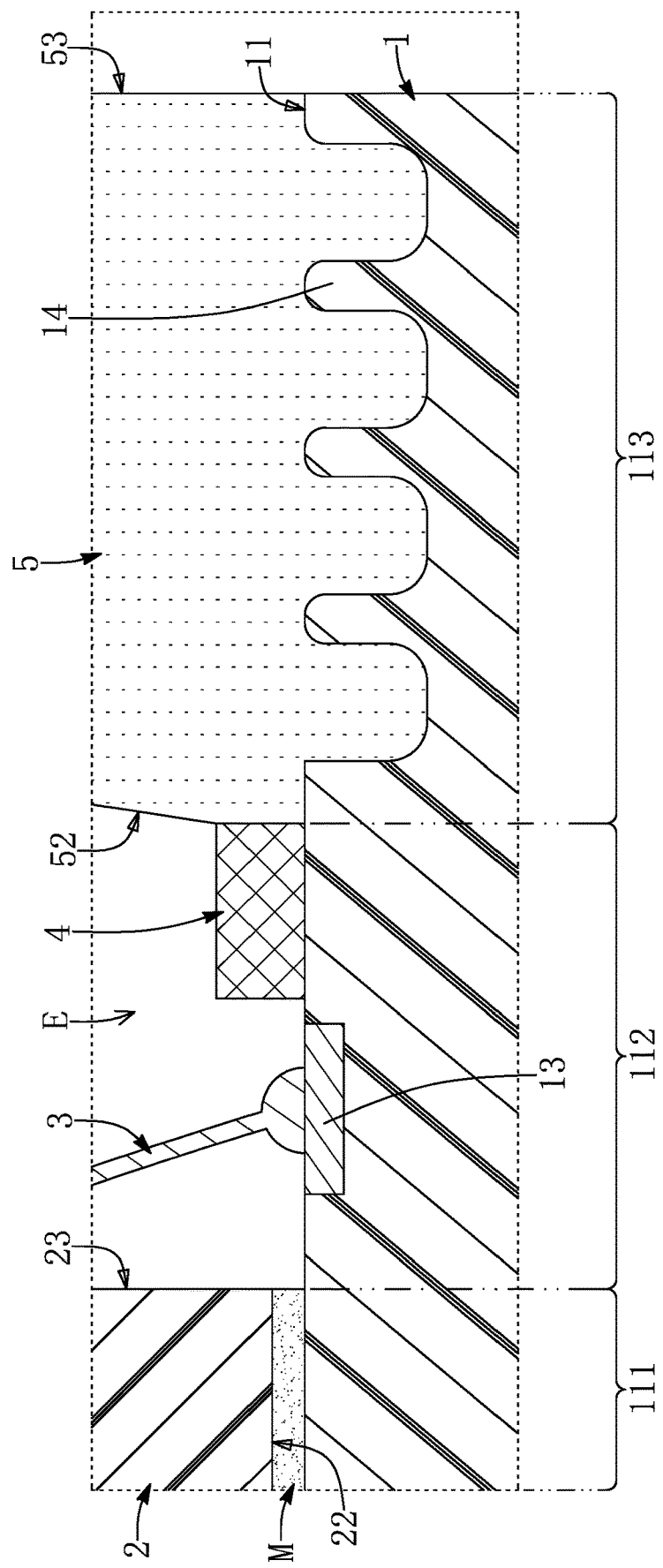
FIG. 7 is an enlarged view of the part VI of FIG. 3 in another configuration.

As shown in FIG. 3 and FIG. 6, the protrusions 14 are formed by protruding outward from the first surface 11, and a top side of any one of the protrusions 14 is higher than the chip-bonding region 111 and is lower than the sensor chip 2 with respect to the first surface 11. A step difference G between the chip-bonding region 111 of the first surface 11 and the top side of any one of the protrusions 14 is preferably within a range from 10 um to 40 um, but the present disclosure is not limited thereto. For example, as shown in FIG. 7, the protrusions 14 can be formed by recessing inward from the first surface 11, and the top side of any one of the protrusions 14 is not higher than the chip-bonding region 111 with respect to the first surface 11.

In addition, as shown in FIG. 3, the substrate 1 can be further provided with a plurality of soldering balls 9 disposed on the second surface 12. The substrate 1 can be soldered onto an electronic component (not shown in the drawings) through the soldering balls 9, thereby electrically connecting the sensor package structure 100 to the electronic component.

As shown in FIG. 3 and FIG. 6, the sensor chip 2 in the present embodiment is an image sensing chip, but the present disclosure is not limited thereto. A bottom surface 22 of the sensor chip 2 is fixed onto the chip-bonding region 111 of the substrate 1. In other words, the sensor chip 2 is arranged to be surrounded on the inside of the soldering pads 13.

It should be noted that the sensor package structure 100 in the present embodiment includes an adhesive M (e.g., a thermally conductive adhesive) disposed on the chip-bonding region 111, and the sensor chip 2 is fixed to the chip-bonding region 111 through the adhesive M (e.g., the bottom surface 22 of the sensor chip 2 is adhered to the chip-bonding region 111 through the adhesive M), but the present disclosure is not limited thereto. For example, in other embodiments of the present disclosure not shown in the drawings, the adhesive M can be omitted or can be replaced by other components.

Moreover, a top surface 21 of the sensor chip 2 has a sensing region 211 and a plurality of connection pads 212 that are arranged outside of the sensing region 211. The number and position of the connection pads 212 in the present embodiment respectively correspond to those of the soldering pads 13 of the substrate 1. Each of the metal wires 3 has a first end and a second end. The first ends of the metal wires 3 are respectively connected to the soldering pads 13, and the second ends of the metal wires 3 are respectively connected to the connection pads 212, so that the substrate 1 can be electrically coupled to the sensor chip 2 through the metal wires 3.

The ring-shaped stopping rib 4 is disposed on the first surface 11 of the substrate 1, and is located between the protrusions 14 and the soldering pads 13 (i.e., the protrusions 14 are located outside of the ring-shaped stopping rib 4, and the soldering pads 13 are located inside of the ring-shaped stopping rib 4). In the present embodiment, the ring-shaped stopping rib 4 is located adjacent to the protrusions 14, and is configured to be a distribution boundary for the protrusions 14. The ring-shaped stopping rib 4 is preferably lower than any one of the protrusions 14 with respect to the first surface 11, but the present disclosure is not limited thereto.

The ring-shaped wall 5 is formed on the connection region 113 of the substrate 1, and the protrusions 14 of the substrate 1 are embedded in and gaplessly connected to the ring-shaped wall 5. Accordingly, since the protrusions 14 of the substrate 1 are embedded in and gaplessly connected to the ring-shaped wall 5, the contact area and connection strength between the substrate 1 and the ring-shaped wall 5 can be effectively increased, and the protrusions 14 are provided to extend (i.e., lengthen) a traveling path of moisture that is defined along the connection interface between the substrate 1 and the ring-shaped wall 5.

Moreover, in a forming process of the ring-shaped wall 5, the ring-shaped stopping rib 4 is configured to block the ring-shaped wall 5 to flow to any one of the soldering pads 13 (or the sensor chip 2), thereby preventing the forming process of the ring-shaped wall 5 from affecting the connection between any one of the metal wires 3 and the corresponding soldering pad 13, but the present disclosure is not limited thereto.

In the present embodiment, a top side 51 of the ring-shaped wall 5 has a stepped shape and has a first tread surface 511, a second tread surface 512, and a riser surface 513 that connects the first tread surface 511 and the second tread surface 512. The first tread surface 511 is higher than the sensor chip 2, and is also higher than a top of any one of the metal wires 3 with respect to the first surface 11. The second tread surface 512 is higher than the first tread surface 511 with respect to the first surface 11. The riser surface 513 is slantingly connected to the first tread surface 511 and the second tread surface 512 (e.g., the riser surface 513 is ring-shaped, and an inner diameter of the riser surface 513 gradually increases in a direction from the first tread surface 511 toward the second tread surface 512).

Specifically, the ring-shaped wall 5 has an outer wall surface 53 and an inner wall surface 52 that is opposite to the outer wall surface 53. The outer wall surface 53 is connected to the second tread surface 512 and is coplanar with a lateral side of the substrate 1. The inner wall surface 52 is connected to the first tread surface 511 and the ring-shaped stopping rib 4. An angle between the inner wall surface 52 and the first tread surface 511 is preferably in a range from 90 degrees to 120 degrees, but the present disclosure is not limited thereto.

The light-permeable layer 6 in the present embodiment is a glass sheet, but the present disclosure is not limited thereto. The light-permeable layer 6 has an inner surface 61, an outer surface 62, and a surrounding lateral surface 63 that connects the inner surface 61 and the outer surface 62. The inner surface 61 of the light-permeable layer 6 is disposed on the ring-shaped wall 5 and faces toward the sensing region 211, and the light-permeable layer 6, the ring-shaped wall 5, and the substrate 1 jointly define an enclosed space E therein.

In the present embodiment, the light-permeable layer 6 (e.g., an outer lateral portion of the inner surface 61) is disposed on the first tread surface 511 of the ring-shaped wall 5 (through a glue), and the second tread surface 512 of the ring-shaped wall 5 is higher than the inner surface 61 of the light-permeable layer 6 and is lower than the outer surface 62 of the light-permeable layer 6 with respect to the first surface 11.

Moreover, the external sealing adhesive 7 is connected (e.g., adhered) to the surrounding lateral surface 63 of the light-permeable layer 6, the second tread surface 512, and the riser surface 513, thereby preventing moisture from passing through the connection interface between the ring-shaped wall 5 and the light-permeable layer 6. The external sealing adhesive 7 in the present embodiment is gaplessly connected to the surrounding lateral surface 63 of the light-permeable layer 6, the second tread surface 512, and the riser surface 513, and can be further connected to a part of the first tread surface 511, thereby ensuring that the connection interface between the light-permeable layer 6 and the ring-shaped wall 5 is sealed.

Second Embodiment

Figure 8:
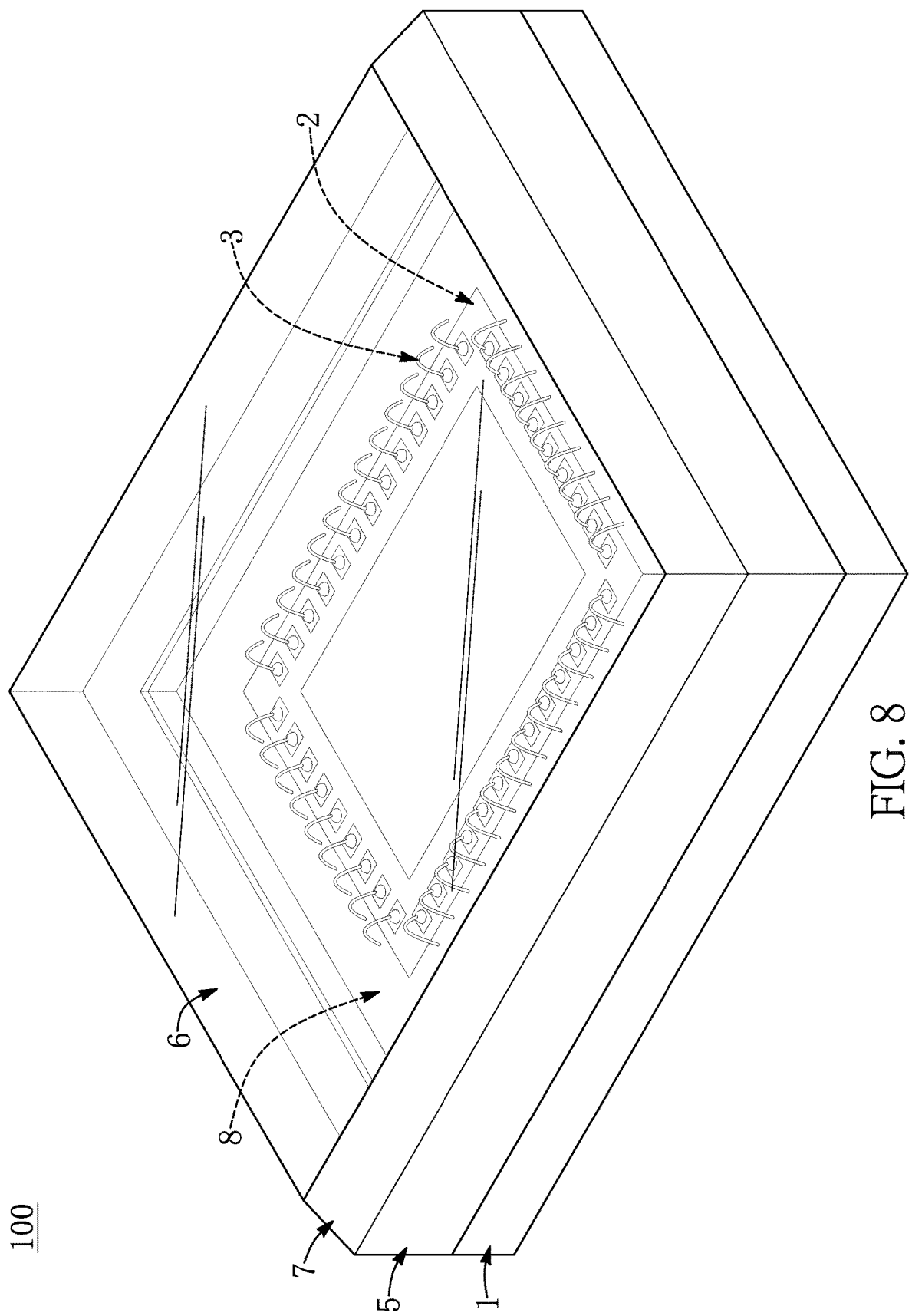
FIG. 8 is a perspective view of the sensor package structure according to a second embodiment of the present disclosure.
Figure 9:
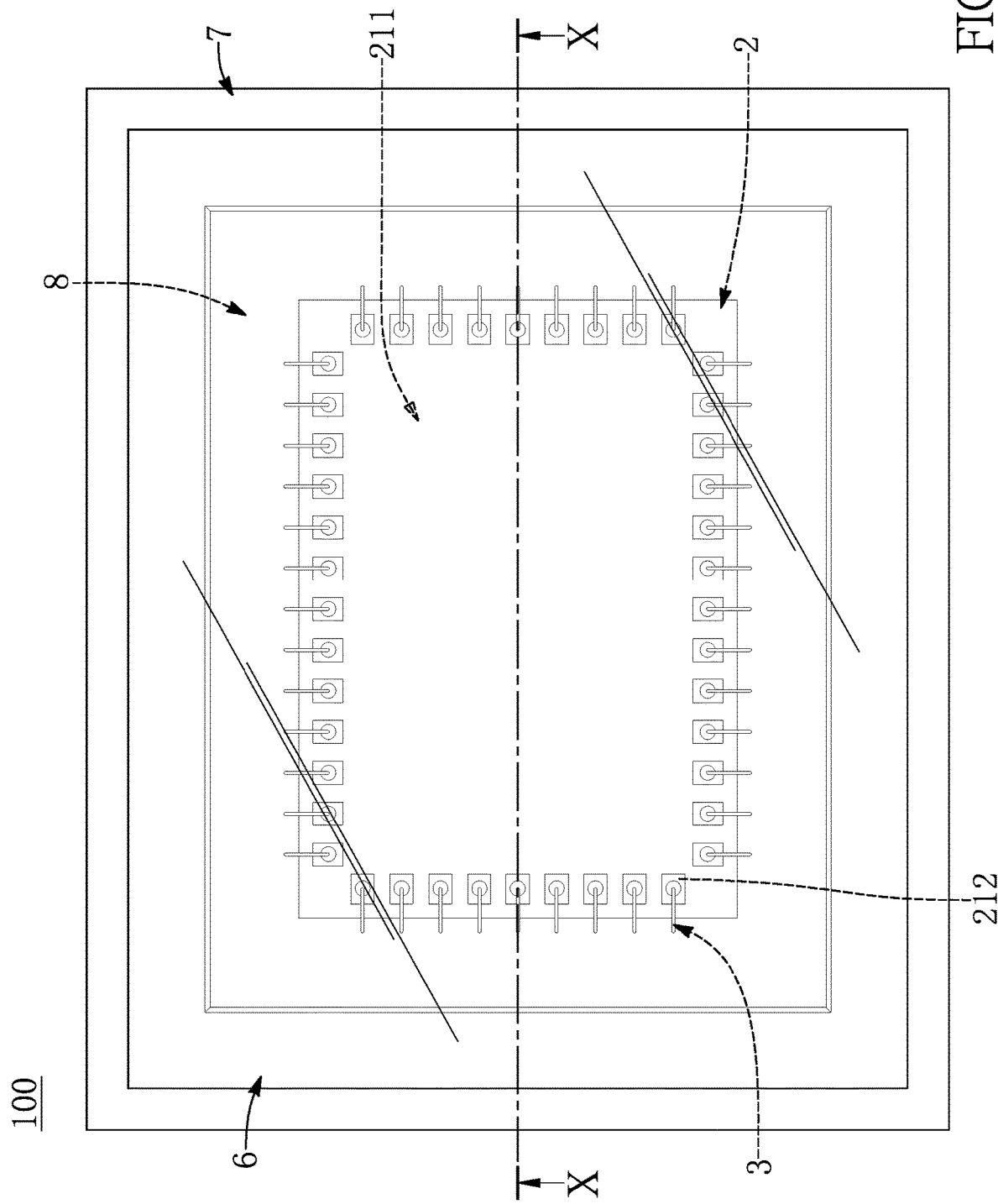
FIG. 9 is a top view of FIG. 8.
Figure 10:
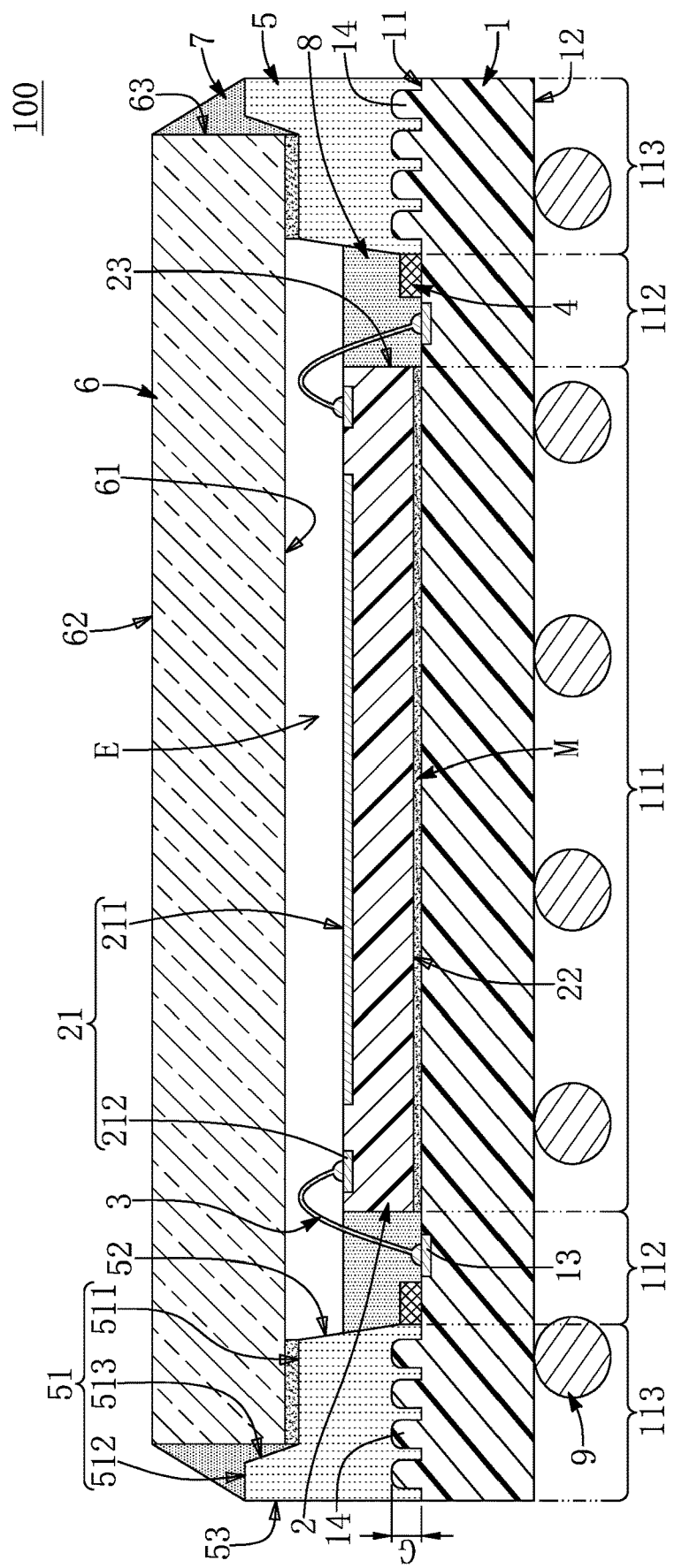
FIG. 10 is a cross-sectional view taken along line X-X of FIG. 9.

Referring to FIG. 8 to FIG. 10, a second embodiment of the present disclosure is provided, which is similar to the first embodiment of the present disclosure. For the sake of brevity, descriptions of the same components in the first and second embodiments of the present disclosure will be omitted herein, and the following description only discloses different features between the first and second embodiments.

In the present embodiment, the sensor package structure 100 further includes an internal sealing adhesive 8 formed on the first surface 11 of the substrate 1. The internal sealing adhesive 8 is located between the sensor chip 2 and the ring-shaped wall 5 (e.g., the internal sealing adhesive 8 is located on the spacing region 112), and each of the soldering pads 13 and a part of the corresponding metal wire 5 connected thereto are embedded in the internal sealing adhesive 8.

In other words, the internal sealing adhesive 8 is filled in a slot that is jointly defined by the spacing region 112 of the substrate 1, an outer lateral surface 23 of the sensor chip 2, and the inner wall surface 52 of the ring-shaped wall 5. Moreover, the internal sealing adhesive 8 in the present embodiment is connected to and covers at least 10% to 50% (area) of the outer lateral surface 23 of the sensor chip 2, and does not in contact with the top surface 21 of the sensor chip 2.

In summary, the internal sealing adhesive 8 in the present embodiment is provided to further extend the traveling path of moisture from the substrate 1 to the sensing region 211 of the sensor chip 2, and can be configured to effectively decrease a gas content in the enclosed space E for reducing the influence of thermal expansion and contraction of the gas on the sensor package structure 100.

Beneficial Effects of the Embodiments

In conclusion, the sensor package structure of the present disclosure is provided with the protrusions that are embedded in and gaplessly connected to the ring-shaped wall, so that the contact area and connection strength between the substrate and the ring-shaped wall can be effectively increased, and the protrusions can be provided to extend a traveling path of moisture that is defined along the connection interface between the substrate and the ring-shaped wall.

Moreover, the sensor package structure of the present disclosure is provided with the internal sealing adhesive that is filled between the sensor chip and the ring-shaped wall, so that the internal sealing adhesive can be provided to further extend the traveling path of moisture from the substrate to the sensing region of the sensor chip, and the internal sealing adhesive can be configured to effectively decrease a gas content in the enclosed space for reducing the influence of thermal expansion and contraction of the gas on the sensor package structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
a substrate having a first surface and a second surface that is opposite to the first surface, wherein the first surface of the substrate has a chip-bonding region and a connection region that surrounds the chip-bonding region, and the substrate has a plurality of protrusions arranged on the connection region;
a sensor chip disposed on the chip-bonding region of the substrate and electrically coupled to the substrate;
a ring-shaped wall formed on the connection region of the substrate, wherein the protrusions of the substrate are embedded in and gaplessly connected to the ring-shaped wall;
a light-permeable layer disposed on the ring-shaped wall, wherein the light-permeable layer, the ring-shaped wall, and the substrate jointly define an enclosed space therein; and
a ring-shaped stopping rib disposed on the first surface of the substrate, wherein the ring-shaped stopping rib is located between the protrusions and the soldering pads, and wherein the ring-shaped stopping rib is located adjacent to the protrusions and is lower than any one of the protrusions with respect to the first surface.

2. The sensor package structure according to claim 1, wherein the protrusions are bump dots, and the protrusions are in a ring-shaped arrangement and are distributed on at least 80% of the connection region.

3. The sensor package structure according to claim 1, wherein the substrate includes a plurality of soldering pads located between the chip-bonding region and the connection region, the sensor chip includes a plurality of connection pads, and the sensor package structure includes a plurality of metal wires each having a first end and a second end, and wherein the first ends of the metal wires are respectively connected to the soldering pads, and the second ends of the metal wires are respectively connected to the connection pads.

4. The sensor package structure according to claim 3, further comprising an internal sealing adhesive formed on the first surface of the substrate, wherein the internal sealing adhesive is located between the sensor chip and the ring-shaped wall, and each of the soldering pads and a part of the corresponding metal wire connected thereto are embedded in the internal sealing adhesive.

5. The sensor package structure according to claim 1, wherein a top side of the ring-shaped wall has a stepped shape and has a first tread surface, a second tread surface, and a riser surface that connects the first tread surface and the second tread surface, and the light-permeable layer is disposed on the first tread surface.

6. The sensor package structure according to claim 5, further comprising an external sealing adhesive that is connected to a surrounding lateral surface of the light-permeable layer, the second tread surface, and the riser surface.

7. The sensor package structure according to claim 1, wherein the protrusions protrude outward from the first surface, and a top side of any one of the protrusions is higher than the chip-bonding region with respect to the first surface.

8. The sensor package structure according to claim 1, wherein the protrusions are recessed inward from the first surface, and a top side of any one of the protrusions is not higher than the chip-bonding region with respect to the first surface.

9. A sensor package structure, comprising:
a substrate having a first surface and a second surface that is opposite to the first surface, wherein the first surface of the substrate has a chip-bonding region and a connection region that surrounds the chip-bonding region, and the substrate has a plurality of protrusions arranged on the connection region;
a sensor chip disposed on the chip-bonding region of the substrate and electrically coupled to the substrate;
a ring-shaped wall formed on the connection region of the substrate, wherein the protrusions of the substrate are embedded in and gaplessly connected to the ring-shaped wall;
a light-permeable layer disposed on the ring-shaped wall, wherein the light-permeable layer, the ring-shaped wall, and the substrate jointly define an enclosed space therein; and
a ring-shaped stopping rib disposed on the first surface of the substrate and arranged in the enclosed space.

10. A sensor package structure, comprising:
a substrate having a first surface and a second surface that is opposite to the first surface, wherein the first surface of the substrate has a chip-bonding region and a connection region that surrounds the chip-bonding region, and the substrate has a plurality of protrusions arranged on the connection region, and wherein the protrusions protrude outward from the first surface, and a top side of any one of the protrusions is higher than the chip-bonding region with respect to the first surface;
a sensor chip disposed on the chip-bonding region of the substrate and electrically coupled to the substrate;
a ring-shaped wall integrally formed on the connection region of the substrate, wherein the protrusions of the substrate are embedded in and gaplessly connected to the ring-shaped wall, and the protrusions protrude outward from the first surface, and a top side of any one of the protrusions is higher than the chip-bonding region with respect to the first surface; and
a light-permeable layer disposed on the ring-shaped wall, wherein the light-permeable layer, the ring-shaped wall, and the substrate jointly define an enclosed space therein.

\* \* \* \* \*